United States Patent
Yang et al.

(10) Patent No.: US 7,145,389 B2
(45) Date of Patent: Dec. 5, 2006

(54) TEMPERATURE CONTROLLED, LOG-LINEAR GAIN CONTROL CIRCUIT FOR AMPLIFIERS

(75) Inventors: John-San Yang, Kaohsiung (TW); Yu-Hua Liu, Beipu Township, Hsinchu County (TW)

(73) Assignee: Airoha Technology Corp., Hsinchu (TW)

( * ) Notice: Subject to any disclaimer, the term of this patent is extended or adjusted under 35 U.S.C. 154(b) by 210 days.

(21) Appl. No.: 11/032,425

(22) Filed: Jan. 10, 2005

(65) Prior Publication Data
US 2005/0179493 A1 Aug. 18, 2005

(30) Foreign Application Priority Data
Feb. 12, 2004 (TW) ............................... 93103280 A

(51) Int. Cl.
H03F 3/45 (2006.01)
(52) U.S. Cl. ........................ 330/256; 330/254
(58) Field of Classification Search ..................... None
See application file for complete search history.

(56) References Cited

U.S. PATENT DOCUMENTS 5,994,961 A * 11/1999 Lunn et al. ................. 330/254
6,300,832 B1* 10/2001 Okazaki ..................... 330/254
6,690,236 B1* 2/2004 Saito .......................... 330/254

* cited by examiner

Primary Examiner—Khanh Van Nguyen
(74) Attorney, Agent, or Firm—Thomas, Kayden, Horstemeyer & Risley

(57) ABSTRACT

A gain control circuit and a variable gain amplifier using the same. In the variable gain amplifier, gain control circuit generates a gain control voltage according to a control voltage, and a gain variable amplification unit is coupled to the gain control circuit and an input voltage to adjust an output signal output to a load according to the gain control voltage. In the gain control circuit, a level shifter with a constant current source generates a first voltage according to a control voltage. A first temperature compensation unit has a first temperature-controlled current source, and generates a second voltage according to a present operating temperature. A voltage conversion unit coupled to the level shifter and the first temperature compensation unit generates a gain control voltage according to the first and second voltages.

18 Claims, 8 Drawing Sheets

TEMPERATURE CONTROLLED, LOG-LINEAR GAIN CONTROL CIRCUIT FOR AMPLIFIERS

BACKGROUND

The invention relates to control circuits, and more particularly, to a gain control circuit, and a variable gain amplifier using the same.

FIG. 1 shows a conventional variable gain amplifier. As shown, currents through a differential pair composed of transistors $T_9$ and $T_{10}$ are controlled by the voltage $V_{CTRL}$, and thus, the current $I_L$ through LD can be adjusted. As follows, the current $I_L$ can be obtained by equation 1, wherein gm is the gain of the variable gain amplifier 50, $V_{RF}$ is an input voltage and $V_T$ is a temperature parameter.

$$Irf = gm \times V_{RF} \quad (1)$$
$$I_L = Irf\left(1 + \tanh\frac{V_{CTRL}}{V_T}\right)$$

FIG. 2 and FIG. 3 show relationships between the gain control voltage $V_{CTRL}$ and the gain gm of the amplifier 50 respectively. As shown, the relational curve RC of the gain control voltage $V_{CTRL}$ and the gain gm is not linear in the range of 0~20 db. A gain control circuit is required to generate a corresponding gain control voltage according to an external control voltage to obtain relational curve RC for the amplifier 50, wherein there is a log-linear relationship between the external control voltage and the gain of the amplifier 50.

Further, current $I_L$ relates to the temperature parameter $V_T$, wherein $$V_T = \frac{kT}{q},$$

k is Boltzmann constant, T is absolute temperature, and q is electron charge.

In view of this, current switching characteristics of the variable gain amplifier 50 changes with temperature, such that gain of the amplifier 50 is affected by temperature and log-linear relationship between an external control voltage and gain of amplifier gain 50 cannot be obtained.

SUMMARY

Embodiments of the invention provide a gain control circuit, in which a level shifter with a constant current source generates a first voltage according to a control voltage. A first temperature compensation unit has a first temperature-controlled current source and generates a second voltage according to the present operating temperature. A voltage conversion unit is coupled to the level shifter and the first temperature compensation unit to generate a gain control voltage according to the first voltage and the second voltage.

Also provided is a variable gain amplifier, in which a gain control circuit generates a gain control voltage according to a control voltage, and a gain variable amplification unit is coupled to the gain control circuit and an input voltage to adjust an output signal output to a load according to the gain control voltage.

BRIEF DESCRIPTION OF THE DRAWINGS

The invention can be more fully understood by the subsequent detailed description and examples with reference made to the accompanying drawings, wherein.

DETAILED DESCRIPTION

Figure 1:
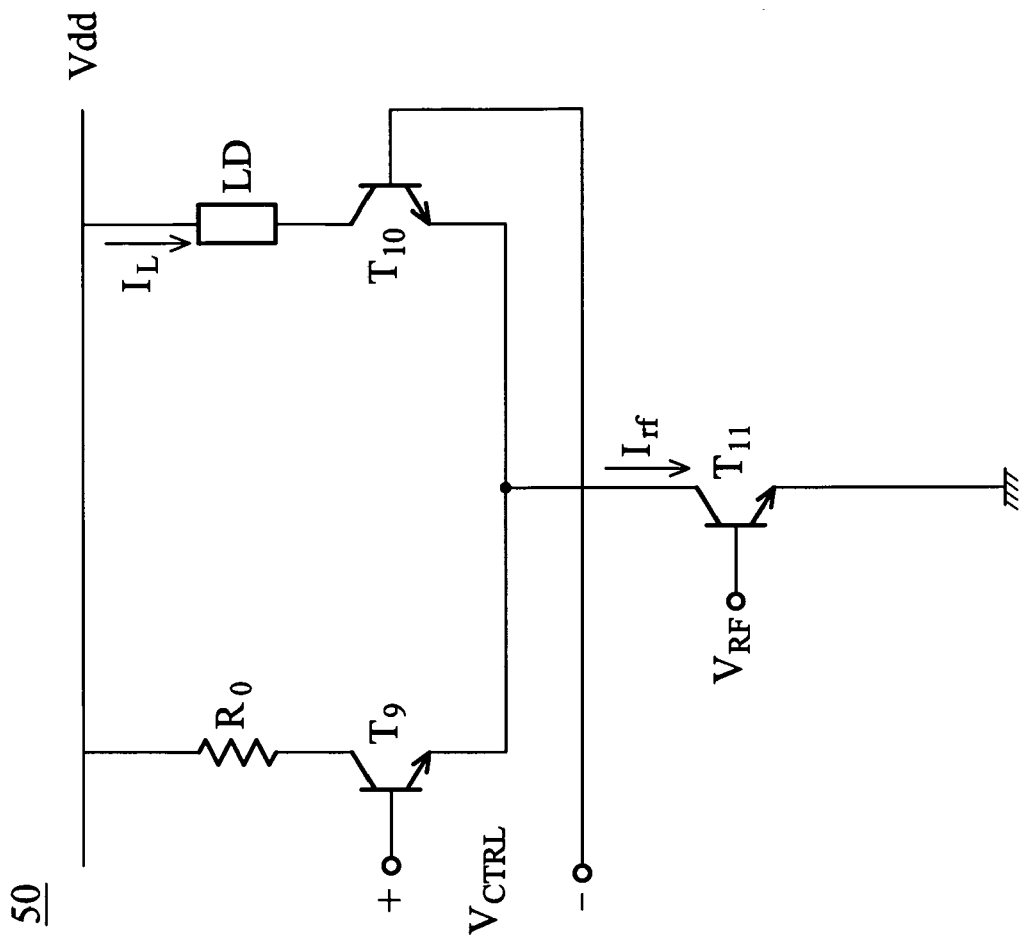
FIG. 1 shows a conventional variable gain amplifier.
Figure 4:
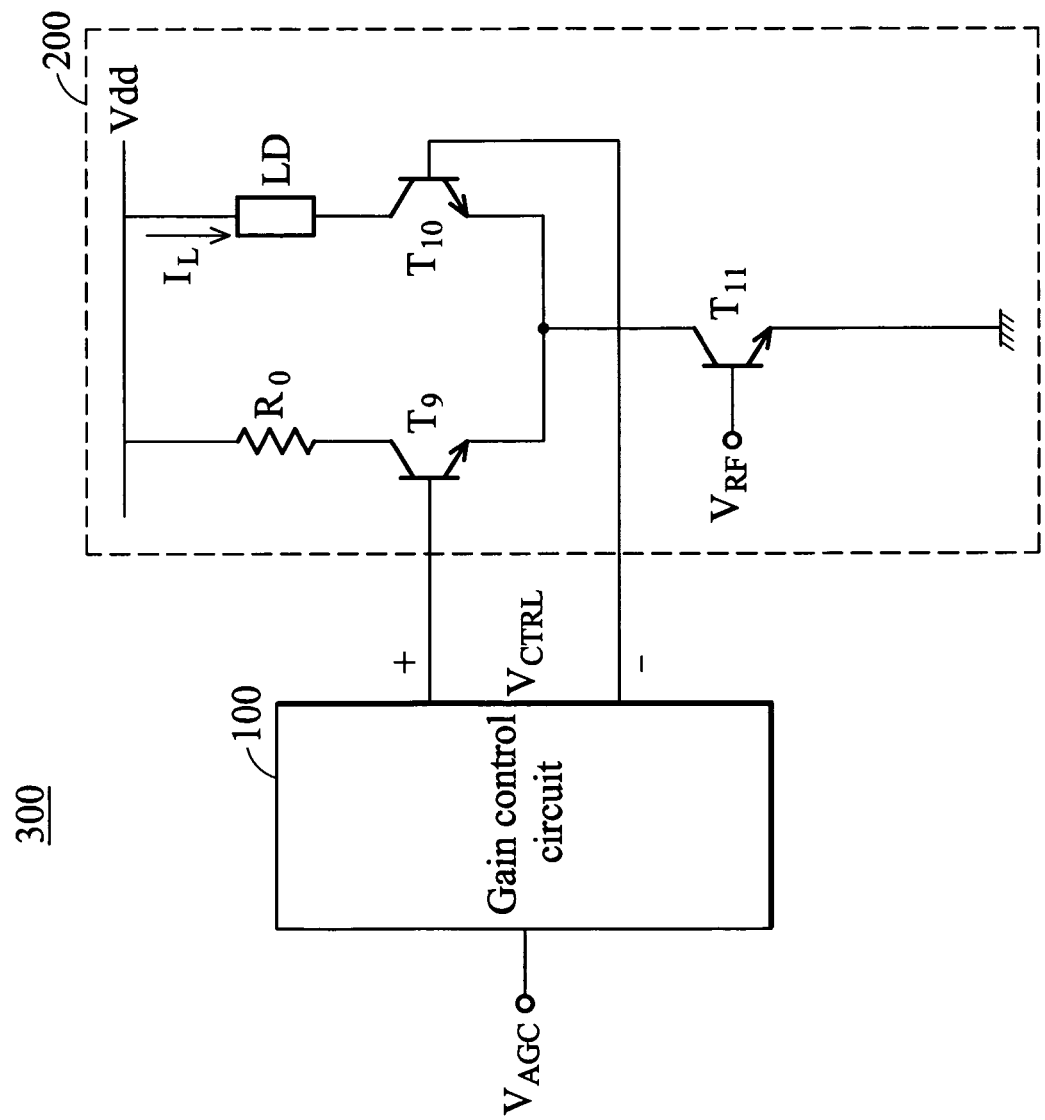
FIG. 4 shows a variable gain amplifier of a embodiments of the invention.

FIG. 4 shows a variable gain amplifier of embodiments of the invention. As shown, the variable gain amplifier 300 includes a gain control circuit 100 and a variable gain amplification unit 200. The gain control circuit 100 generates a gain control voltage $V_{CTRL}$ according to a control voltage $V_{AGC}$. The variable gain amplification unit 200 is coupled to the gain control circuit 100 and an input voltage $V_{RF}$ to adjust the output signal, such as current $I_L$, output to the load according to the gain control voltage $V_{CTRL}$. For example, the currents flowing through a differential pair comprising transistors $T_9$ and $T_{10}$ can be controlled by the voltage $V_{CTRL}$, and thus, the current $I_L$ through the road LD can be adjusted, as can the gain of the variable gain amplifier unit 200. In this case, the variable gain amplification unit 200 is similar to the amplifier 50 shown in FIG. 1, and includes a differential pair comprising transistors $T_9$ and $T_{10}$, a resistor $R_0$ and a transistor $T_{11}$.

Figure 2:
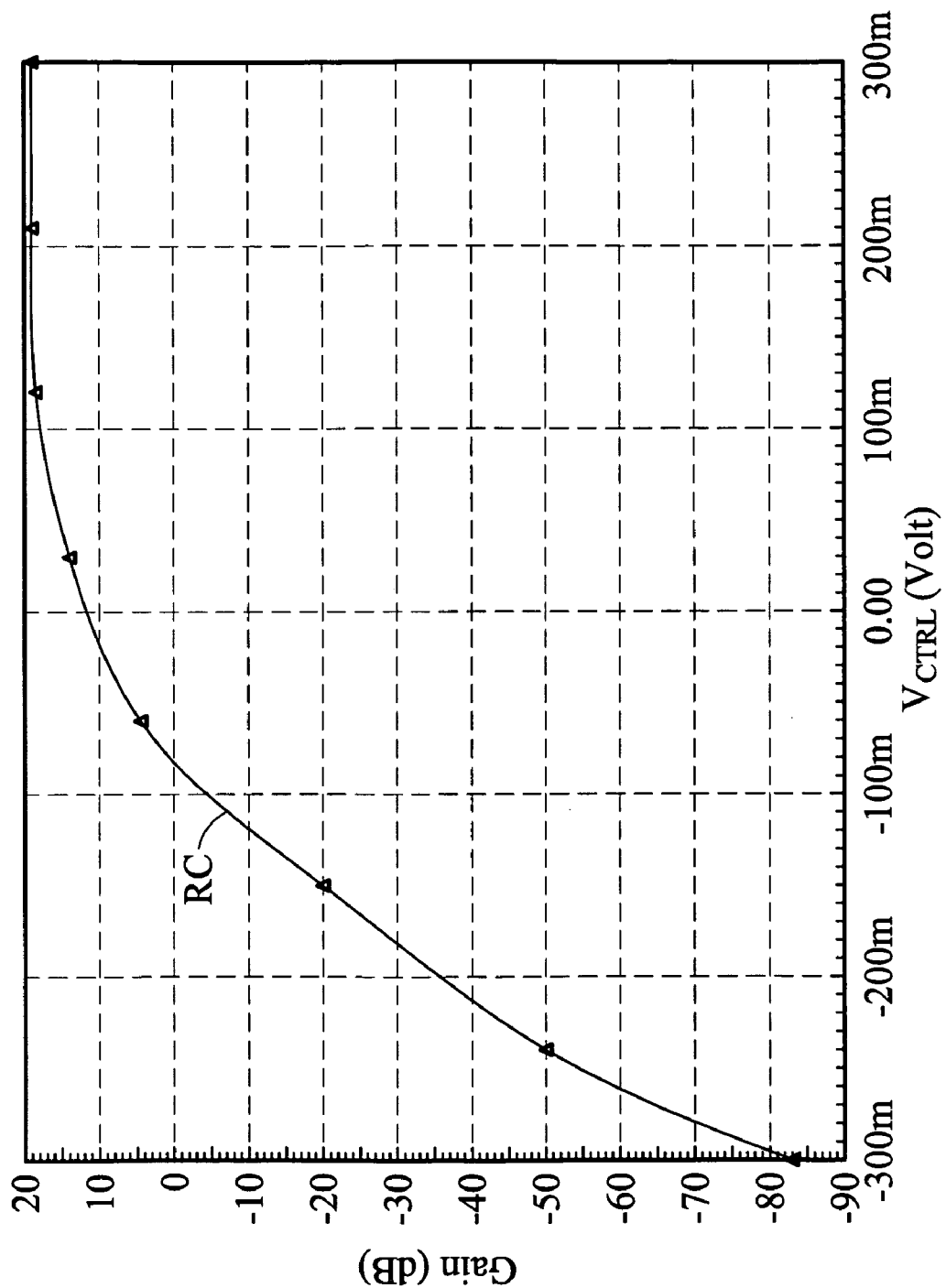
FIG. 2 shows relationships between the gain control voltage and the gain of the amplifier.
Figure 5:
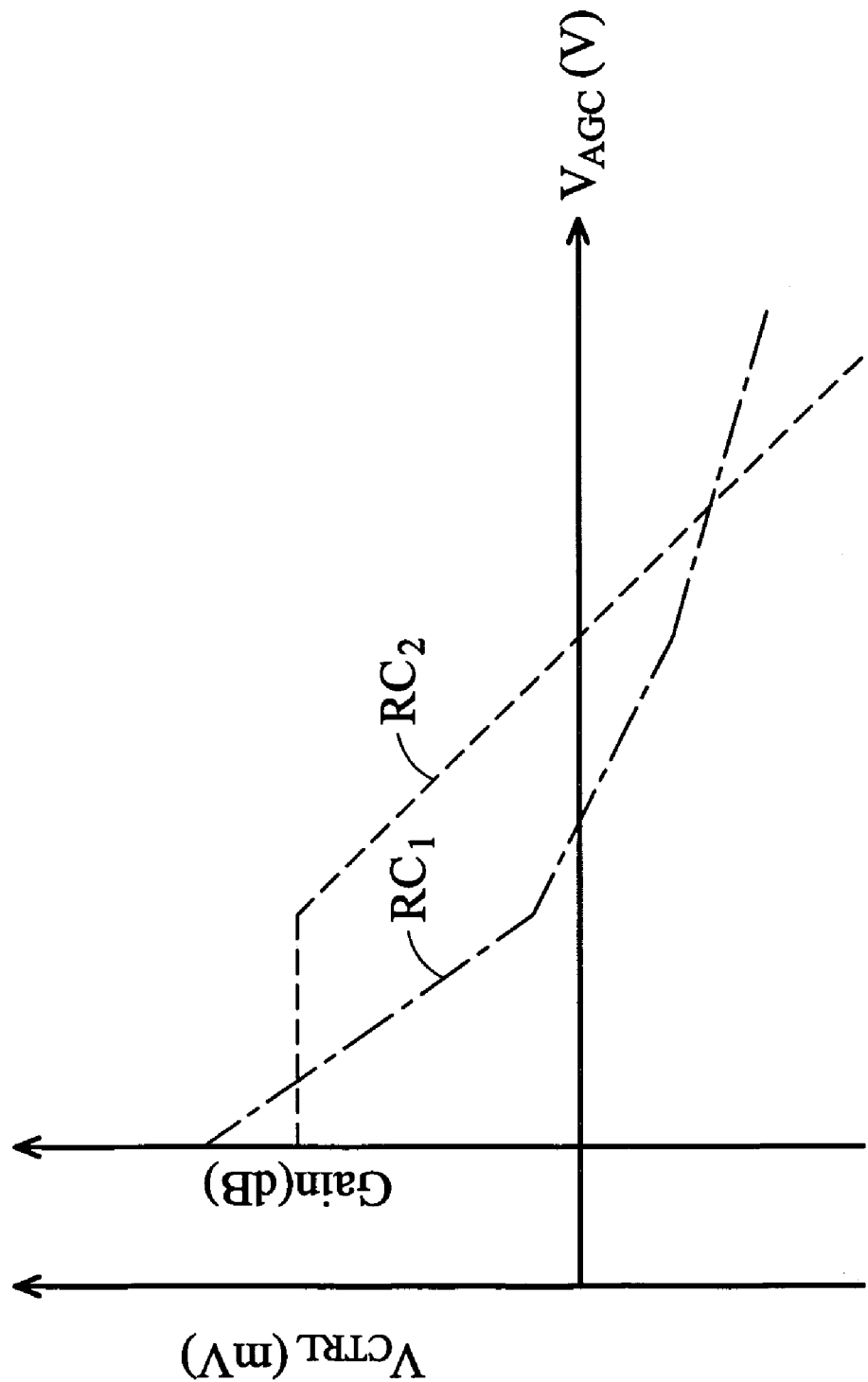
FIG. 5 shows a relational curve between the control voltage and the gain control voltage and a relational curve between the control voltage and gain of the amplification unit in the variable gain amplifier.

FIG. 5 shows a relational curve $RC_1$ between the control voltage $V_{AGC}$ and the gain control voltage $V_{CTRL}$ and a relational curve $RC_2$ between the control voltage $V_{AGC}$ and gain of the amplification unit 200 in the variable gain amplifier 300. As shown, a log-linear relationship between the gain of the amplification 200 and the control voltage $V_{AGC}$ input to the gain control circuit 100 is obtained, such that the relationship between the gain control voltage $V_{CTRL}$ and the gain of the amplification unit 200 is similar to the curve RC shown in FIG. 2.

Further, to maintain constant gain control characteristic, the gain control voltage $V_{CTRL}$ is adjusted as temperature changes. Thus, constant current sources which do not change with temperature and temperature-controlled current sources which change with temperature can both utilize. Gain control voltage $V_{CTRL}$ rises with temperature to compensate inference by the parameter $V_T$, thereby maintaining the gain control characteristic of the variable gain amplifier 300.

First Embodiment

Figure 6:
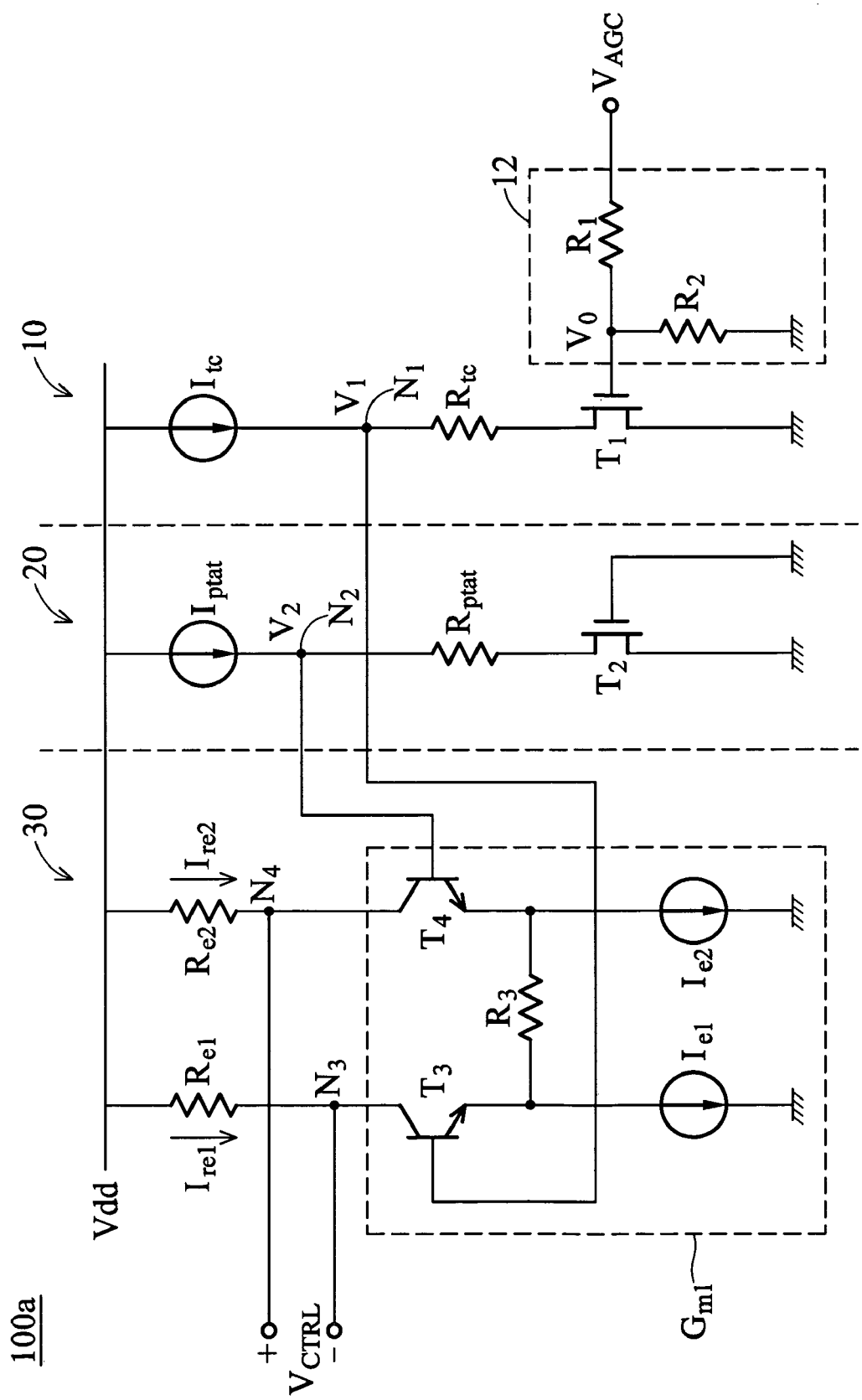
FIG. 6 shows a gain control circuit of a first embodiment of the invention.

FIG. 6 shows a gain control circuit of a first embodiment of the invention. As shown, the gain control circuit 100a includes a level shifter 10, a temperature compensation unit 20 and a voltage conversion unit 30.

The level shifter 10 generates a first voltage $V_1$ according to a control voltage $V_{AGC}$, and includes a voltage divider 12, a transistor $T_1$ and a constant current source $I_{tc}$. The voltage divider 12, for example, can comprise resistors $R_1$ and $R_2$ to generate a divided voltage $V_0$ according to the control voltage $V_{AGC}$. The transistor $T_1$ has a control terminal coupled to the divided voltage $V_0$, a first terminal coupled to the grounded voltage (GND) and a second terminal coupled to a first node $N_1$ through a resistor $R_{tc}$. The constant current $I_{tc}$ is coupled between the first node $N_1$ and a power voltage Vdd, and does not change with temperature. The first voltage $V_1$ produced by the control voltage $V_{AGC}$ turns the transistor $T_1$ on and off to adjust the current through the resistor $R_{tc}$, thereby adjusting the voltage $V_1$ at the node $N_1$.

The temperature compensation unit 20 includes a transistor $T_2$ and a temperature-controlled current source $I_{ptat}$. The transistor $T_2$ has a first terminal coupled to a second node $N_2$ through the resistor $R_{ptat}$, and a control terminal and a second terminal coupled to the grounded voltage GND. The temperature-controlled current source $I_{ptat}$ is coupled between the second node $N_2$ and the power voltage Vdd, and changes with temperature. The current generated by the temperature-controlled current source $I_{ptat}$ changes with temperature to adjust the current through the resistor $R_{ptat}$, thereby adjusting the voltage $V_2$ at the second node $N_2$. While the current source $I_{ptat}$ can be proportional to absolute temperature (PTAT), but it is to be understood that the disclose is not limited thereto.

The voltage conversion unit 30 includes a transducer $G_{m1}$ and two resistive elements $R_{e1}$ and $R_{e2}$. The transducer $G_{m1}$ converts the first voltage $V_1$ from the level shifter 10 and the second voltage $V_2$ from the temperature compensation unit 20 to a first current $I_{re1}$ and a second current $I_{re2}$. The resistive elements $R_{e1}$ and $R_{e2}$ generate a voltage difference between the nodes $N_3$ and $N_4$ according to the first and second currents $I_{re1}$ and $I_{re2}$. The two resistive elements $R_{e1}$ and $R_{e2}$, here, can be resistors, but it is to be understood that the disclose is not limited thereto. The voltage difference between the nodes $N_3$ and $N_4$ serves as the gain control voltage $V_{CRLT}$ and is output to the variable gain amplification unit 200. The transducer $G_{m1}$ includes a differential pair comprising transistors $T_3$ and $T_4$, a resistor $R_3$ and two current sources $I_{e1}$ and $I_{e2}$. The control terminals of the transistors $T_3$ and $T_4$ are coupled to the first voltage $V_1$ and the second voltage $V_2$ respectively. According to the first voltage $V_1$ and the second voltage $V_2$, the currents $I_{re1}$ and $I_{re2}$ can be adjusted, thereby adjusting the gain control voltage $V_{CTRL}$.

The temperature-controlled current source $I_{ptat}$ thus adjusts the second voltage $V_2$ with temperature, to increase the gain control voltage $V_{CTRL}$ to compensate for the parameter $V_T$ and maintain gain control characteristics of the variable gain amplifier 300.

Second Embodiment

Figure 7:
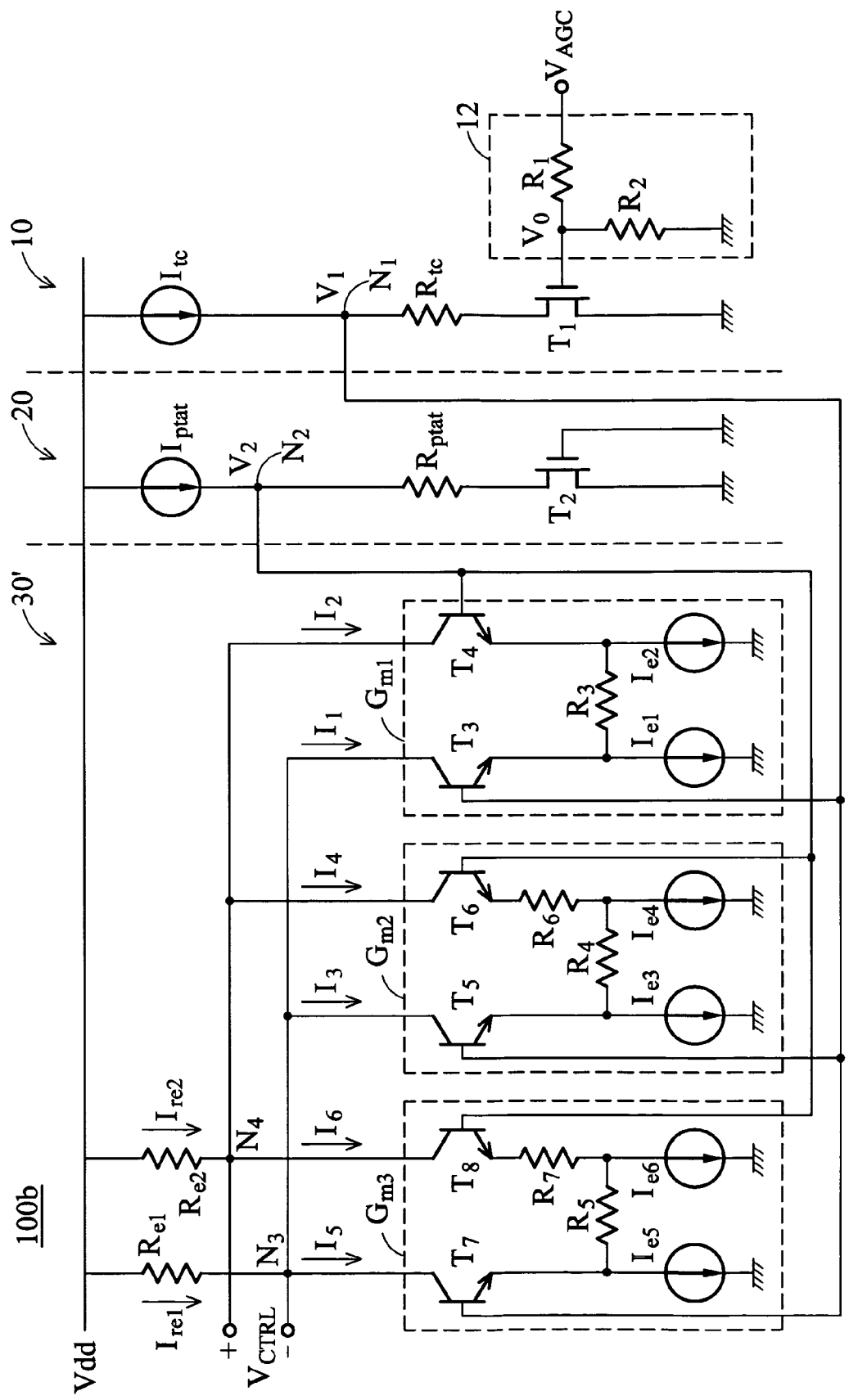
FIG. 7 shows a gain control circuit of a second embodiment of the invention.

FIG. 7 is a gain control circuit of a second embodiment of the invention. As shown, the gain control circuit 100b includes a level shifter 10, a temperature compensation unit 20 and a voltage conversion unit 30'. The level shifter 10 generates a first voltage $V_1$ according to a control voltage $V_{AGC}$, the temperature compensation unit 20 generates a second voltage $V_2$ according to current temperature, and the voltage conversion unit 30 generates a gain control voltage $V_{CTRL}$ according to the first voltage $V_1$ and the second voltage $V_2$. In this embodiment, the level shifter 10 and the temperature compensation unit 20 are similar to those in the first embodiment, and are thus not described.

Voltage conversion unit 30' includes three transducers $G_{m1}$~$G_{m3}$ and two resistive elements $R_{e1}$ and $R_{e2}$, wherein the three transducers $G_{m1}$~$G_{m3}$ have different trigger voltages. The transducers $G_{m1}$~$G_{m3}$ convert the first voltage $V_1$ from the level shifter 10 and the second voltage $V_2$ from the temperature compensation unit 20 to first to sixth currents $I_{re1}$~$I_{re6}$. The resistive elements $R_{e1}$ and $R_{e2}$ generate a voltage difference between nodes $N_3$ and $N_4$ according to the first, second, third, fourth and sixth currents $I_{re1}$~$I_{re6}$. The voltage difference between the nodes $N_3$ and $N_4$ serves as the gain control voltage $V_{CRL}$ and is output to the variable gain amplification unit 200.

The transducer Gm1 includes a differential pair comprising transistors $T_3$ and $T_4$, a resistor $R_3$ and two current sources $I_{e1}$ and $I_{e2}$. The control terminals of the transistors $T_3$ and $T_4$ are coupled to the first voltage $V_1$ and the second voltage $V_2$, respectively. According to the first voltage $V_1$ and the second voltage $V_2$, the currents $I_1$ and $I_2$ can be adjusted. The transducer $Gm_2$ includes a differential pair comprising transistors $T_5$ and $T_6$, two resistors $R_4$ and $R_6$ and two current sources $I_{e3}$ and $I_{e4}$. The control terminals of the transistors $T_5$ and $T_6$ are coupled to the first voltage $V_1$ and the second voltage $V_2$, respectively. According to the first voltage $V_1$ and the second voltage $V_2$, the currents $I_3$ and $I_4$ can be adjusted. The transducer $G_{m3}$ includes a differential pair comprising transistors $T_7$ and $T_8$, two resistors $R_5$ and $R_7$ and two current sources $I_{e5}$ and $I_{e6}$. The control terminals of the transistors $T_7$ and $T_8$ are coupled to the first voltage $V_1$ and the second voltage $V_2$, respectively. According to the first voltage $V_1$ and the second voltage $V_2$, the currents $I_5$ and $I_6$ can be adjusted.

The transducers $G_{m1}$~$G_{m3}$ here have first, second and third trigger voltages respectively, because the resistors $R_6$ and $R_7$ are different. For example, only transducer $G_{m1}$ is turned on to generate the first current $I_1$ and the second current $I_2$ according to the voltages $V_1$ and $V_2$ and transducers $G_{m2}$ and $G_{m3}$ do not work when the voltage difference between the voltages $V_1$ and $V_2$ exceeds a first predetermined level.

If the voltage difference between the voltages $V_1$ and $V_2$ exceeds a second predetermined level, both transducers Gm1 and $G_{m2}$ are turned on to generate the first to fourth currents $I_1$~$I_4$ according to the voltage $V_1$ and $V_2$, and the transducer $G_{m3}$ does not work. In this case, the current $I_{re1}$ can be the total of the currents $I_1$ and $I_3$, and the current $I_{re2}$ can be the total of the current $I_2$ and $I_4$.

Alternatively, the transducers $G_{m1}$~$G_{m3}$ are all turned on to generate the first to sixth current $I_1$~$I_6$ according to the voltages $V_1$ and $V_2$ when voltage difference between the voltages $V_1$ and $V_2$ exceeds a third predetermined level. In this case, the current Ire1 can be the total of the currents $I_1$, $I_3$ and $I_5$, and the current $I_{re2}$ can be the total of the current $I_2$, $I_4$ and $I_6$.

Figure 3:
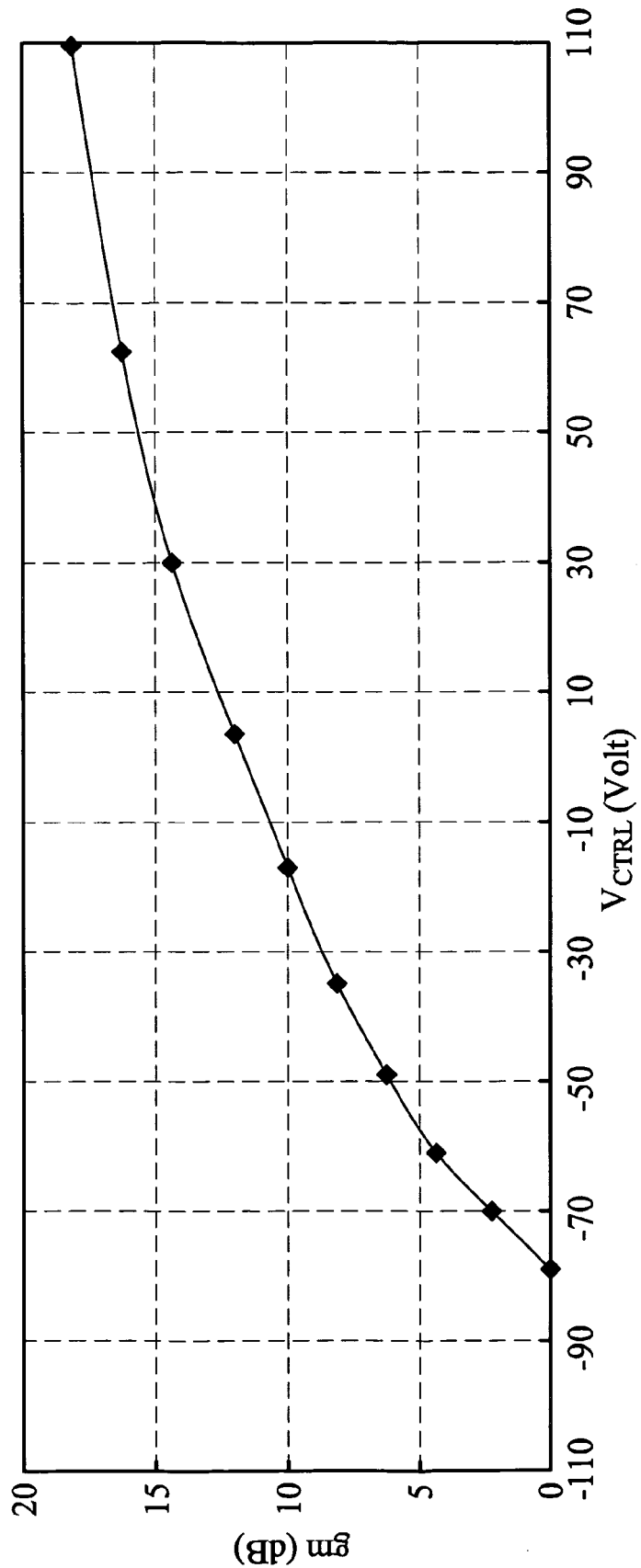
FIG. 3 shows relationships between the gain control voltage $V_{CTRL}$ and the gain gm of the amplifier.

As shown in FIG. 3, when the gain of the variable gain amplifier changes in the low gain region, such as 0~5 dB, the corresponding gain control voltage $V_{CTRL}$ requires a larger change slope, but when the gain of the variable gain amplifier changes in the high gain region, such as 10~20 dB, the corresponding gain control voltage $V_{CTRL}$ requires a smaller change slope. Thus, a plurality of transducers with different trigger voltages are turned on progressively as the gain changes such that the change slope of the control voltage $V_{AGC}$ and the corresponding gain becomes steeper and log-linear relationship between the control voltage $V_{AGC}$ and the corresponding gain is maintained.

In addition, the temperature-controlled current source $I_{ptat}$ adjusts the second voltage $V_2$ with temperature to increase the gain control voltage $V_{CTRL}$ to compensate for the parameter $V_T$ and maintain gain control characteristics of the variable gain amplifier 300.

Thus, the relationship between the gain control voltage $V_{CTRL}$ and the gain of the gain amplification unit (relational curve RC shown in FIG. 3) is obtain and the gain control characteristics of the variable gain amplifier 300 does not change with temperature.

Figure 8:
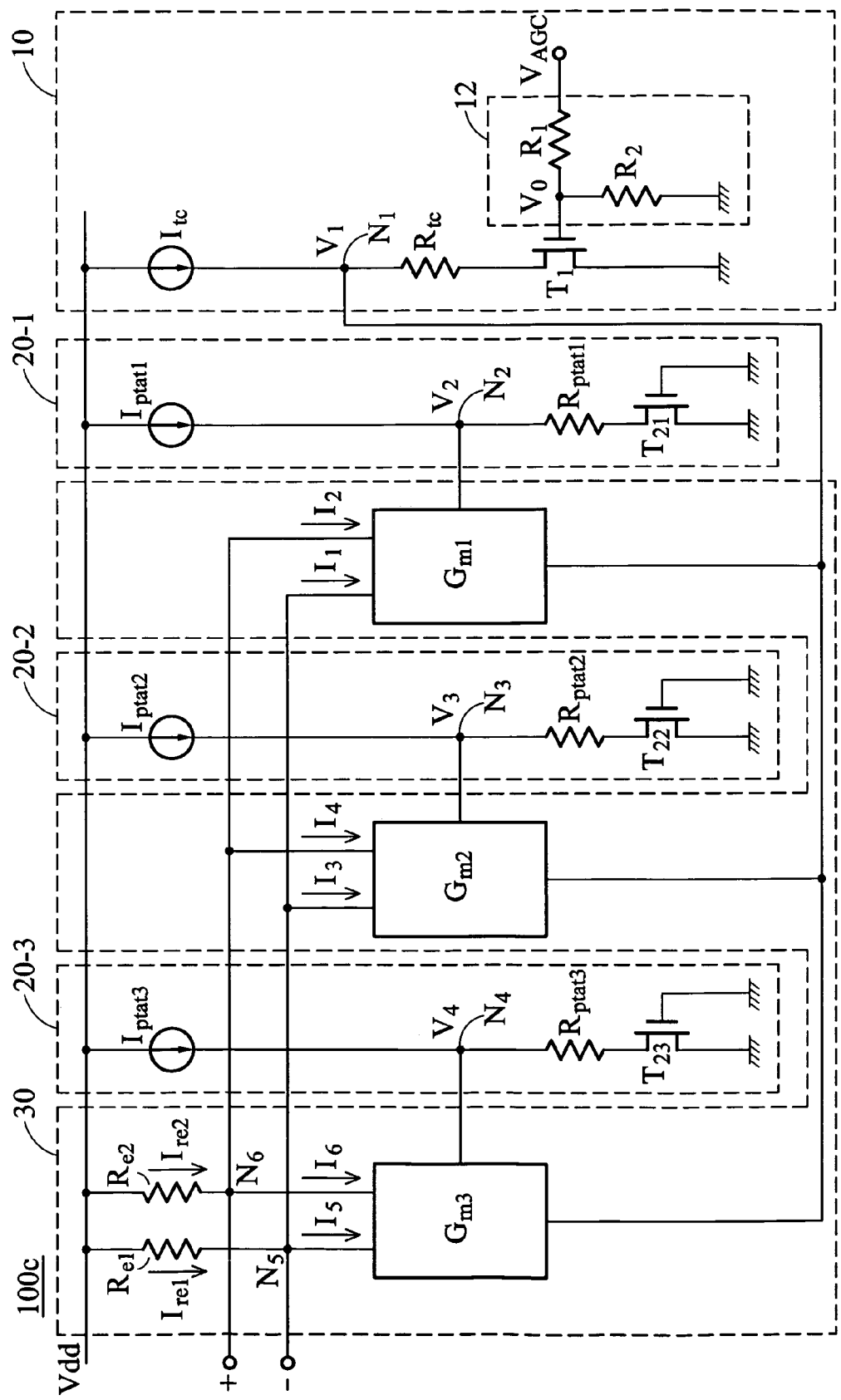
FIG. 8 shows a gain control circuit of a third embodiment of the invention.

Third Embodiment FIG. 8 shows a gain control circuit of a third embodiment of the invention. As shown, the gain control circuit 100c includes a level shifter 10, three temperature compensation units 20-1~20-3 and a voltage conversion unit 30'. The level shifter 10 generates a first voltage $V_1$ according to a control. voltage $V_{AGC}$, and level shifter 10 is similar to that in the above embodiments, and is not thus described. Temperature compensation units 20-1~20-30 generate a second voltage $V_2$, a third voltage $V_3$ and a fourth voltage $V_4$ respectively, according to current temperature. The voltage conversion unit 30' generates a gain control voltage $V_{CTRL}$ according to the first voltage $V_1$, the second voltage $V_2$, the third voltage $V_3$ and the fourth voltage $V_4$. The temperature compensation units 20-1~20-3 each is similar to those in the first and second embodiments, and are thus not described.

Voltage conversion unit 30' includes three transducers $G_{m1}$~$G_{m3}$ and two resistive elements $R_{e1}$ and $R_{e2}$, wherein the three transducers $G_{m1}$~$G_{m3}$ have different trigger voltages and the structure thereof is similar to that shown in FIG. 7.

The transducer Gm1 converts the voltage $V_1$ from the level shifter 10 and the voltage $V_2$ from the temperature compensation unit 20-1 to a first current $I_1$ and a second current $I_2$. The transducer $G_{m2}$ converts the voltage $V_1$ from the level shifter 10 and the voltage $V_3$ from the temperature compensation unit 20-2 to a third current $I_3$ and a fourth current $I_4$. The transducer $G_{m3}$ converts the voltage $V_1$ from the level shifter 10 and the voltage $V_4$ from the temperature compensation unit 20-3 to a fifth current $I_5$ and a sixth current $I_6$. Namely, the transducer $G_{m1}$ adjusts the currents $I_1$ and $I_2$ according to the voltages $V_1$ and $V_2$, the transducer $G_{m2}$ adjusts the currents $I_2$ and $I_4$ according to the voltages $V_1$ and $V_3$, and the transducer $G_{m3}$ adjusts the currents $I_5$ and $I_6$ according to the voltages $V_1$ and $V_4$.

For example, transducers $G_{m1}$~$G_{m3}$, with corresponding trigger voltage, can generate the first to sixth current $I_1$~$I_6$ according to the first to fourth voltage $V_1$~$V_4$. In this case, the current $I_{re1}$ can be the total of currents $I_1$, $I_3$ and $I_5$, and the current $I_{re2}$ the total of the current $I_2$, $I_4$ and $I_6$. Resistive elements $R_{e1}$ and $R_{e2}$ generate a voltage difference between the node $N_5$ and $N_6$ according to currents $I_{re1}$ and $I_{re2}$. The voltage difference between the nodes $N_5$ and $N_6$ serve as the gain control voltage $V_{CTRL}$ and is output to the variable gain amplification unit 200.

As shown in FIG. 3, when the gain of the variable gain amplifier changes in the low gain region, such as 0~5 dB, the corresponding gain control voltage $V_{CTRL}$ requires a larger change slope, but when the gain of the variable gain amplifier changes in the high gain region, such as 10~20 dB, the corresponding gain control voltage $V_{CTRL}$ requires a smaller change slope. Thus, a plurality of transducers with different trigger voltages are turned on progressively as the gain changes such that the change slope of the control voltage $V_{AGC}$ and the corresponding gain becomes steeper and log-linear relationship between the control voltage $V_{AGC}$ and the corresponding gain is maintained.

In addition, as temperature changes, the temperature-controlled current sources $I_{ptat1}$, $I_{ptat2}$ and $I_{ptat3}$ adjust the second voltages $V_2$, $V_3$ and $V_4$ respectively to increase gain control voltage $V_{CTRL}$ to compensate for the parameter $V_T$ and maintain the gain control characteristic of the variable gain amplifier 300.

Thus, the relationship between the gain control voltage $V_{CTRL}$ and the gain of the gain amplification unit (relational curve RC shown in FIG. 3) is obtain and the gain control characteristics of the variable gain amplifier 300 does not change with temperature.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A gain control circuit, comprising:
   a level shifter with a constant current source, generating a first voltage according to a control voltage;
   a first temperature compensation unit, comprising a first temperature-controlled current source, to generate a second voltage according to present operating temperature; and
   a voltage conversion unit coupled to the level shifter and the first temperature compensation unit to generate a gain control voltage according to the first voltage and the second voltage.

2. The gain control circuit as claimed in claim 1, wherein the first temperature-controlled current source is proportional to absolute temperature (PTAT).

3. The gain control circuit as claimed in claim 2, wherein the voltage conversion unit comprises:
   a transducer coupled to the level shifter and the first temperature compensation unit to convert the first voltage and the second voltage to a first current and a second current respectively; and
   first and second resistive elements coupled to the transducer to convert the first current and the second current to the gain control voltage.

4. The gain control circuit as claimed in claim 3, wherein the level shifter further comprises:
   a voltage divider coupled to the control voltage, generating a first divided voltage; and
   a first transistor comprising a control terminal coupled to the first divided voltage, a first terminal coupled to a grounded voltage and a second terminal coupled to a first node through a first resistor, wherein the constant current is coupled between the first node and a power voltage.

5. The gain control circuit as claimed in claim 4, wherein the temperature compensation unit further comprises a second transistor comprising a first terminal coupled to a second node through a resistor, and a second terminal coupled to the grounded voltage, wherein the first temperature-controlled current source is coupled between the second node and the power voltage.

6. The gain control circuit as claimed in claim 5, wherein the transducer comprises a differential pair having differential input terminals coupled to the first node and the second nodes respectively, wherein voltages on the first node and the second node serve as the first voltage and the second voltage respectively.

7. The gain control circuit as claimed in claim 2, wherein the voltage conversion unit comprises:
- a first transducer with a first trigger voltage, generating a first current and a second current when voltage difference between the first voltage and the second voltage exceeds the first trigger voltage;
- a second transducer with a second trigger voltage, generating a third current and a fourth current when voltage difference between the first voltage and the second voltage exceeds the second trigger voltage; and
- first and second resistive elements coupled to the first and second transducers, generating the control voltage according to the first, second, third and fourth currents from the first and second transducers.

8. The gain control circuit as claimed in claim 1, further comprising a second compensation unit, comprising a second temperature-controlled current source, to generate a third voltage according to the present operating temperature, wherein the voltage conversion unit generates the gain control voltage according to the first, second and third voltages.

9. The gain control circuit as claimed in claim 8, wherein the voltage conversion unit comprises:
- a first transducer with first trigger voltage, coupled to the first temperature compensation unit, generating a first current and a second current when voltage difference between the first voltage and the second voltage exceeds the first trigger voltage;
- a second transducer with second trigger voltage, coupled to the second temperature compensation unit, generating a third current and a fourth current when voltage difference between the first voltage and the second voltage exceeds the second trigger voltage; and
- first and second resistive elements coupled to the first and second transducers, generating the control voltage according to the first, second, third and fourth currents from the first and second transducers.

10. A variable gain amplifier, comprising:
- a gain control circuit generating a gain control voltage according to a control voltage, the gain control circuit comprising:
  - a level shifter with a constant current source, generating a first voltage according to a control voltage;
  - a first temperature compensation unit, comprising a first temperature-controlled current source, generating a second voltage according to present operating temperature; and
  - a voltage conversion unit coupled to the level shifter and the first temperature compensation unit to generate a gain control voltage according to the first voltage and the second voltage; and
- a gain variable amplification unit coupled to the gain control circuit and an input voltage to adjust an output signal output to a load according to the gain control voltage.

11. The variable gain amplifier as claimed in claim 10, wherein the first temperature-controlled current source is proportional to absolute temperature (PTAT).

12. The variable gain amplifier as claimed in claim 11, wherein the voltage conversion unit comprises:
- a transducer coupled to the level shifter and the first temperature compensation unit, converting the first voltage and the second voltage to a first current and a second current respectively; and
- first and second resistive elements coupled to the transducer, converting the first current and the second current to the gain control voltage.

13. The variable gain amplifier as claimed in claim 12, wherein the level shifter further comprises:
- a voltage divider coupled to the control voltage, generating a first divided voltage; and
- a first transistor comprising a control terminal coupled to the first divided voltage, a first terminal coupled to a grounded voltage and a second terminal coupled to a first node through a first resistor, wherein the constant current is coupled between the first node and a power voltage.

14. The variable gain amplifier as claimed in claim 13, wherein the temperature compensation unit further comprises a second transistor comprising a first terminal coupled to a second node through a resistor, and a second terminal coupled to the grounded voltage, wherein the first temperature-controlled current source is coupled between the second node and the power voltage.

15. The variable gain amplifier as claimed in claim 14, wherein the transducer comprises a differential pair comprising differential input terminals coupled to the first node and the second nodes respectively, wherein voltages on the first node and the second node serve as the first voltage and the second voltage respectively.

16. The variable gain amplifier as claimed in claim 10, wherein the voltage conversion unit comprises:
- a first transducer with a first trigger voltage, generating a first current and a second current when voltage difference between the first voltage and the second voltage exceeds the first trigger voltage;
- a second transducer with a second trigger voltage, generating a third current and a fourth current when voltage difference between the first voltage and the second voltage exceeds the second trigger voltage; and
- first and second resistive elements coupled to the first and second transducers, generating the control voltage according to the first, second, third and fourth currents from the first and second transducers.

17. The variable gain amplifier as claimed in claim 10, further comprising a second compensation unit, comprising a second temperature-controlled current source, generating a third voltage according to the present operating temperature, wherein the voltage conversion unit generates the gain control voltage according to the first, second and third voltages.

18. The variable gain amplifier as claimed in claim 17, wherein the voltage conversion unit comprises:
- a first transducer with first trigger voltage, coupled to the first temperature compensation unit, generating a first current and a second current when voltage difference between the first voltage and the second voltage exceeds the first trigger voltage;
- a second transducer with second trigger voltage, coupled to the second temperature compensation unit, generating a third current and a fourth current when voltage difference between the first voltage and the second voltage exceeds the second trigger voltage; and
- first and second resistive elements coupled to the first and second transducers, generating the control voltage according to the first, second, third and fourth currents from the first and second transducers.

* * * * *